(12) United States Patent
Paek

(10) Patent No.: US 6,927,478 B2
(45) Date of Patent: Aug. 9, 2005

(54) REDUCED SIZE SEMICONDUCTOR PACKAGE WITH STACKED DIES

(75) Inventor: Jong Sik Paek, Kwanglu-shi (KR)

(73) Assignee: Amkor Technology, Inc., Chandler, AZ (US)

(*) Notice: Subject to any disclaimer, the term of this patent is extended or adjusted under 35 U.S.C. 154(b) by 0 days.

(21) Appl. No.: 10/043,946

(22) Filed: Jan. 11, 2002

(65) Prior Publication Data
US 2002/0093087 A1 Jul. 18, 2002

(30) Foreign Application Priority Data
Jan. 15, 2001 (KR) .......................................... 2001-2163

(51) Int. Cl.[7] .............................................. H01L 23/495
(52) U.S. Cl. ...................... 257/666; 257/676; 257/678; 257/734; 257/777
(58) Field of Search ................................ 257/666, 676, 257/678, 734, 777, 686, 778, 707

(56) References Cited

U.S. PATENT DOCUMENTS

| 3,838,984 A | 10/1974 | Crane et al. |
| 4,054,238 A | 10/1977 | Lloyd et al. |
| 4,530,152 A | 7/1985 | Roche et al. |

(Continued)

FOREIGN PATENT DOCUMENTS

| DE | 19734794 A1 | 8/1997 | | |
| EP | 0794572 A2 | 10/1997 | | |
| JP | 5745959 | 3/1982 | | |
| JP | 59227143 | 12/1984 | | |
| JP | 60195957 | 10/1985 | | |
| JP | 6139555 | 2/1986 | | |
| JP | 61248541 | 11/1986 | | |
| JP | 629639 | 1/1987 | | |
| JP | 63205935 | 8/1988 | | |
| JP | 63233555 | 9/1988 | | |
| JP | 1106456 | 4/1989 | | |
| JP | 692076 | 4/1994 | | |
| JP | 7312405 | 11/1995 | | |
| JP | 8125066 | 5/1996 | | |
| JP | 8306853 | 11/1996 | | |
| JP | 98205 | 1/1997 | | |
| JP | 98206 | 1/1997 | | |
| JP | 98207 | 1/1997 | | |
| JP | 992775 | 4/1997 | | |
| KR | 941979 | 1/1994 | | |
| KR | 9772358 | 11/1997 | | |
| KR | 2002049944 | * 12/2000 | ......... | H01L/23/498 |
| KR | 19950018924 | 10/2002 | | |

Primary Examiner—Mary Wilczewski
Assistant Examiner—Monica Lewis
(74) Attorney, Agent, or Firm—Stetina Brunda Garred & Brucker

(57) ABSTRACT

A semiconductor package comprising a plurality of leads. Each of the leads defines opposed first and second surfaces, and a third surface which is also disposed in opposed relation to the second surface. The first surface is oriented between the second and third surfaces. The semiconductor package further comprises first and second semiconductor dies which each define opposed first and second surfaces. Disposed on the first surface of the first semiconductor die are a plurality of bond pads, with bond pads also being disposed on the second surface of the semiconductor die. The first surface of the first semiconductor die is attached to the second surface of each of the leads, with the first surface of the second semiconductor die being attached to the second surface of the first semiconductor die. A plurality of conductive connectors or wires electrically connect the bond pads of the first and second semiconductor dies to respective ones of the leads. An encapsulating portion is applied to and at least partially encapsulates the leads, the first and second semiconductor dies, and the conductive connectors.

16 Claims, 4 Drawing Sheets

U.S. PATENT DOCUMENTS

| | | | |
|---|---|---|---|
| 4,707,724 A | | 11/1987 | Suzuki et al. |
| 4,756,080 A | | 7/1988 | Thorp, Jr. et al. |
| 4,812,896 A | | 3/1989 | Rothgery et al. |
| 5,041,902 A | | 8/1991 | McShane |
| 5,157,480 A | | 10/1992 | McShane et al. |
| 5,172,213 A | | 12/1992 | Zimmerman |
| 5,172,214 A | | 12/1992 | Casto |
| 5,200,362 A | | 4/1993 | Lin et al. |
| 5,200,809 A | | 4/1993 | Kwon |
| 5,214,845 A | | 6/1993 | King et al. |
| 5,216,278 A | | 6/1993 | Lin et al. |
| 5,221,642 A | | 6/1993 | Burns |
| 5,258,094 A | | 11/1993 | Furui et al. |
| 5,273,938 A | | 12/1993 | Lin et al. |
| 5,277,972 A | | 1/1994 | Sakumoto et al. |
| 5,278,446 A | | 1/1994 | Nagaraj et al. |
| 5,279,029 A | | 1/1994 | Burns |
| 5,332,864 A | | 7/1994 | Liang et al. |
| 5,336,931 A | | 8/1994 | Juskey et al. |
| 5,343,076 A | | 8/1994 | Katayama et al. |
| 5,406,124 A | | 4/1995 | Morita et al. |
| 5,424,576 A | | 6/1995 | Djennas et al. |
| 5,435,057 A | | 7/1995 | Bindra et al. |
| 5,474,958 A | | 12/1995 | Djennas et al. |
| 5,521,429 A | | 5/1996 | Aono et al. |
| 5,534,467 A | * | 7/1996 | Rostoker .................. 437/209 |
| 5,604,376 A | | 2/1997 | Hamburgen et al. |
| 5,608,267 A | | 3/1997 | Mahulikar et al. |
| 5,639,990 A | | 6/1997 | Nishihara et al. |
| 5,640,047 A | | 6/1997 | Nakashima |
| 5,641,997 A | | 6/1997 | Ohta et al. |
| 5,646,831 A | | 7/1997 | Manteghi |
| 5,650,663 A | | 7/1997 | Parthasaranthi |
| 5,683,806 A | | 11/1997 | Sakumoto et al. |
| 5,689,135 A | * | 11/1997 | Ball .......................... 257/676 |
| 5,696,666 A | | 12/1997 | Miles et al. |
| 5,701,034 A | | 12/1997 | Marrs |
| 5,710,064 A | | 1/1998 | Song et al. |
| 5,736,432 A | | 4/1998 | Mackessy |
| 5,776,798 A | | 7/1998 | Quan et al. |
| 5,783,861 A | | 7/1998 | Son |
| 5,814,881 A | * | 9/1998 | Alagaratnam et al. ...... 257/686 |
| 5,814,883 A | * | 9/1998 | Sawai et al. ................ 257/712 |
| 5,821,615 A | * | 10/1998 | Lee .......................... 257/686 |
| 5,835,988 A | | 11/1998 | Ishii |
| 5,859,471 A | | 1/1999 | Kuraishi et al. |
| 5,866,939 A | | 2/1999 | Shin et al. |
| 5,877,043 A | | 3/1999 | Alcoe et al. |
| 5,894,108 A | | 4/1999 | Mostafazadeh et al. |
| 5,903,049 A | * | 5/1999 | Mori .......................... 257/686 |
| 5,977,613 A | | 11/1999 | Takata et al. |
| 5,977,630 A | | 11/1999 | Woodworth et al. |
| 5,981,314 A | | 11/1999 | Glenn et al. |
| 5,986,885 A | | 11/1999 | Wyland |
| 6,001,671 A | | 12/1999 | Fjelstad |
| 6,025,640 A | | 2/2000 | Yagi et al. |
| 6,031,279 A | * | 2/2000 | Lenz .......................... 257/686 |
| RE36,613 E | * | 3/2000 | Ball .......................... 257/777 |
| 6,072,228 A | | 6/2000 | Hinkle et al. |
| 6,087,715 A | * | 7/2000 | Sawada et al. ............. 257/666 |
| 6,087,722 A | * | 7/2000 | Lee et al. ................... 257/723 |
| 6,100,594 A | * | 8/2000 | Fukui et al. ................ 257/777 |
| 6,118,184 A | * | 9/2000 | Ishio et al. ................. 257/787 |
| 6,130,115 A | | 10/2000 | Okumura et al. |
| 6,130,473 A | | 10/2000 | Mostafazadeh et al. |
| 6,140,154 A | | 10/2000 | Hinkle et al. |
| 6,143,981 A | | 11/2000 | Glenn |
| 6,181,002 B1 | * | 1/2001 | Juso et al. ................... 257/686 |
| 6,198,171 B1 | * | 3/2001 | Huang et al. ............... 257/787 |
| 6,225,146 B1 | | 5/2001 | Yamaguchi et al. |
| 6,229,200 B1 | | 5/2001 | Mclellan et al. |
| 6,242,281 B1 | | 6/2001 | Mclellan et al. |
| 6,281,568 B1 | | 8/2001 | Glenn et al. |
| 6,294,100 B1 | | 9/2001 | Fan et al. |
| 6,303,984 B1 | * | 10/2001 | Corsis ........................ 257/670 |
| 6,316,838 B1 | * | 11/2001 | Ozawa et al. ............... 257/778 |
| 6,384,472 B1 | * | 5/2002 | Huang ....................... 257/680 |
| 6,410,979 B2 | * | 6/2002 | Abe ........................... 257/684 |
| 6,452,279 B2 | * | 9/2002 | Shimoda .................... 257/777 |
| 6,559,525 B2 | * | 5/2003 | Huang ........................ 257/675 |
| 2002/0011654 A1 | * | 1/2002 | Kimura ...................... 257/686 |

* cited by examiner

REDUCED SIZE SEMICONDUCTOR PACKAGE WITH STACKED DIES

CROSS-REFERENCE TO RELATED APPLICATIONS

The present application claims priority to Korean Patent Application No. 2001-02163 entitled SEMICONDUCTOR PACKAGE filed Jan. 15, 2001.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which includes a stacked pair of semiconductor dies, one of which is electrically connected to the leads of the semiconductor package in a manner facilitating a reduction in the size of the semiconductor package.

2. Description of the Related Art

As is well known in the electrical arts, recent advances in semiconductor package technology have led to the development of packaging techniques which provide for the continuing miniaturization of the semiconductor package. These advancements have also led to the development of a wide variety of new and differing types of semiconductor packages. Consistently in high demand are those semiconductor packages which have a high capacity and are capable of performing various functions. However, those currently known semiconductor packages including only a single semiconductor die are limited in their ability to perform multi-functions. To address this limitation, there has been developed in the prior art various semiconductor packages in which semiconductor dies or the semiconductor packages themselves are stacked on each other. However, these semiconductor packages have structural limits attributable to the stacking of the dies or packages therein, and are often of a size which decreases or diminishes their utility in certain applications. The present invention is specifically adapted to address this deficiency, as will be discussed in more detail below.

BRIEF SUMMARY OF THE INVENTION

In accordance with the present invention, there is provided a semiconductor package which comprises a plurality of leads. Each of the leads defines opposed first and second surfaces, and a third surface which is also disposed in opposed relation to the second surface. The first surface is oriented between the second and third surfaces. Also included in the semiconductor package are first and second semiconductor dies which each define opposed first and second surfaces. A plurality of bond pads are disposed on the first surface of the first semiconductor die, with bond pads also being disposed on the second surface of the second semiconductor die. The first surface of the first semiconductor die is attached to the second surface of each of the leads, with the first surface of the second semiconductor die being attached to the second surface of the first semiconductor die.

In the semiconductor package, a plurality of conductive wires are used to electrically connect the bond pads of the first semiconductor die to respective ones of the first surfaces of the leads. Conductive wires are also used to electrically connect the bond pads of the second semiconductor die to respective ones of the second surfaces of the leads. An encapsulating portion is applied to the leads, the first and second semiconductor dies, and the conductive wires, with the third surface of each of the leads being exposed within the encapsulating portion.

In the semiconductor package of the present invention, the first semiconductor die and the leads are oriented relative to each other such that each of the bond pads of the first semiconductor die is located between a respective pair of the leads. As such, the bond pads of the first semiconductor die do not contact the second surface of any one of the leads. The conductive wires electrically connecting the bond pads of the first semiconductor die to the leads are thus oriented inwardly relative to the peripheral edge of the first semiconductor die. This relative orientation facilitates a reduction in the size of the semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
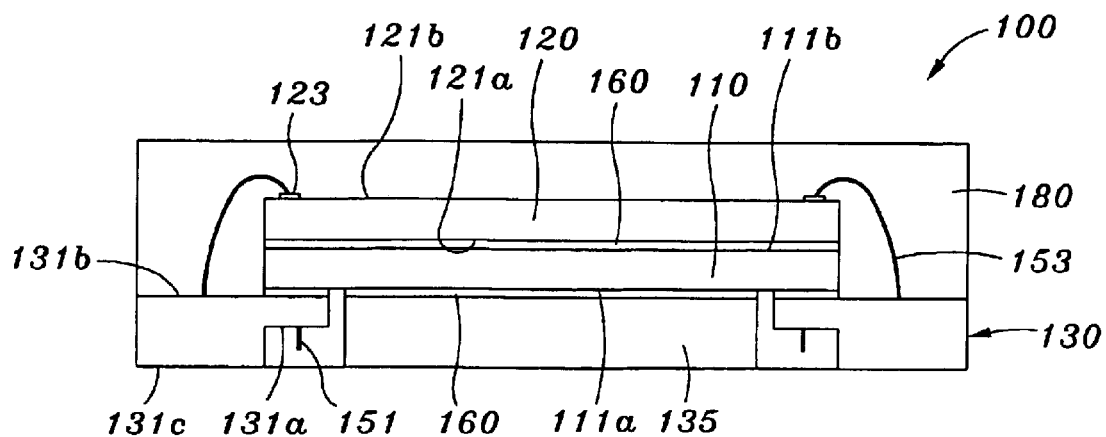
FIG. 1 is a cross-sectional view of a semiconductor package constructed in accordance with the present invention.

Referring now to the drawings wherein the showings are for purposes of illustrating a preferred embodiment of the present invention only, and not for purposes of limiting the same, FIG. 1 provides a cross-sectional view of a semiconductor package 100 constructed in accordance with the present invention. The semiconductor package 100 comprises a plurality of identically configured leads 130. Each of the leads 130 defines a generally planar first (lower) surface 131a and a generally planar second (upper) surface 131b which is disposed in opposed relation to the first surface 131a. Each lead 130 further defines a generally planar third (lower) surface 131c which is also disposed in opposed relation to the second surface 131b and is laterally offset outwardly relative to the first surface 131a. More particularly, the thickness between the second and third surfaces 131b, 131c exceeds the thickness between the first and second surfaces 131a, 131b. The first surfaces 131a of the leads 130 are each preferably formed by a conventional half etching technique using chemical solutions.

Figure 1A:
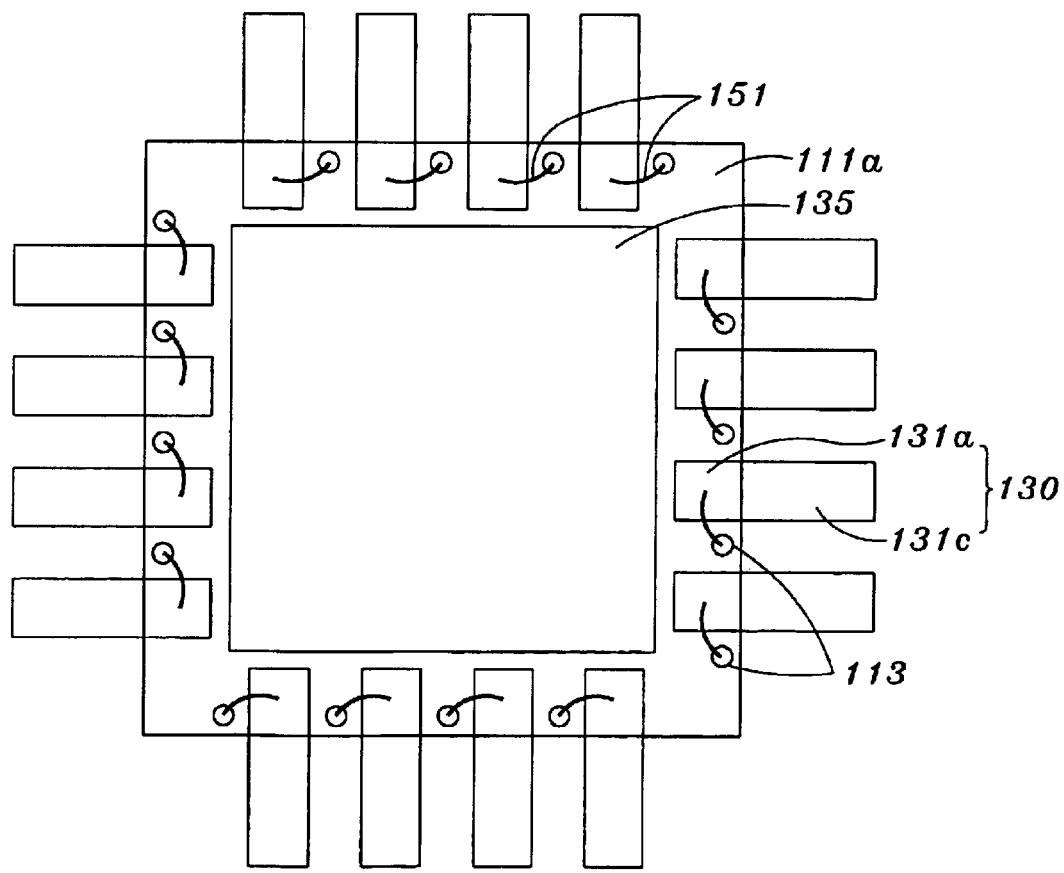
FIG. 1A is a bottom plan view of the semiconductor package shown in FIG. 1, excluding the encapsulating portion thereof.
Figure 1B:
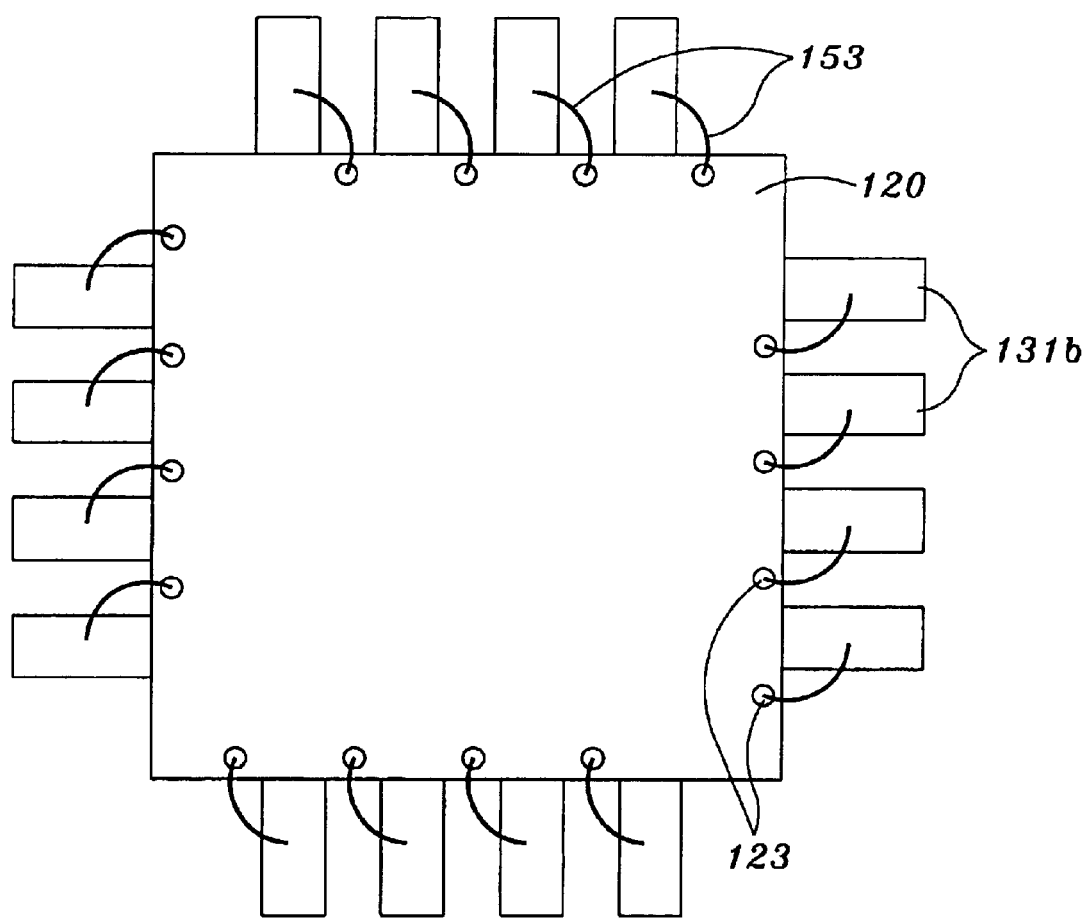
FIG. 1B is a top plan view of the semiconductor package shown in FIG. 1, excluding the encapsulating portion thereof.

In addition to the leads 130, the semiconductor package 100 includes a die paddle 135 which is of a predetermined thickness. The preferred thickness of the die paddle 135 is preferably the same as the thickness between the second and third surfaces 131b, 131c of each of the leads 130. The leads 130 and die paddle 135 are oriented relative to each other such that the leads 130 are arranged about the periphery of the die paddle 135 in the manner best shown in FIG. 1A. The die paddle 135 has a generally square configuration, with the leads 130 being segregated into four sets of four, and each set extending along a respective one of the four peripheral edge segments defined by the die paddle 135. As seen in FIGS. 1 and 1A, the innermost end of each lead 130 is disposed in spaced relation to the corresponding peripheral edge segment of the die paddle 135. Those of ordinary skill in the art will recognize that differing numbers of leads 130 in differing arrangements may be included in the semiconductor package 100, with the size, shape and arrangement of the leads 130 and die paddle 135 as shown in FIGS. 1, 1A and 1B being for exemplary purposes only.

The semiconductor package 100 of the present invention further comprises a first semiconductor die 110 which defines a first surface 111a and a second surface 111b which is disposed in opposed relation to the first surface 111a. The first semiconductor die 110 further includes a plurality of bond pads 113 which are disposed on the first surface 111a thereof. In the semiconductor package 100, portions of the first surface 111a of the first semiconductor die 110 are bonded to the second surface 131b of each lead 130 and to the top surface of the die paddle 135 through the use of a layer of a die attach material 160. The die attach material 160 may be any one of a non-conductive epoxy, a non-conductive polyimide, a non-conductive double-faced adhesive tape or its equivalent, with the present invention not being limited by any particular die attach material 160.

In addition to the first semiconductor die 110, the semiconductor package 100 includes a second semiconductor die 120. The second semiconductor die 120 defines a first surface 121a and a second surface 121b which is disposed in opposed relation to the first surface 121a. Disposed on the second surface 121b blare a plurality of bond pads 123. The first surface 121a of the second semiconductor die 120 is bonded to the second surface 111b of the first semiconductor die 110 by another layer of the die attach material 160.

As seen in FIG. 1A, the first semiconductor die 110 and leads 130 are arranged relative to each other such that the bond pads 113 of the first semiconductor die 110 are each oriented between a respective pair of the leads 130 when the first surface 111a of the first semiconductor die 110 is bonded to the second surfaces 131b of the leads 130. In this regard, it is important in the semiconductor package 100 that none of the bond pads 113 contact any of the second surfaces 131b of the leads 130 when the first surface 111a of the semiconductor die 110 is bonded to the second surfaces 131b of the leads 130. In the semiconductor package 100, each bond pad 113 of the first semiconductor die 120 is electrically connected to the first surface 131a of a respective one of the leads 130 by a first conductive connector 151 such as a conductive wire. Similarly, as seen in FIGS. 1 and 1B, each bond pad 123 of the second semiconductor die 120 is electrically connected to the second surface 131b of a respective one of the leads 130 by a second conductive connector 153 such as a conductive wire. The conductive connectors 151, 153 may each be any one of a gold wire, an aluminum wire, or its equivalent, with the present invention not being limited by any particular material for the conductive connectors 151, 153.

As indicated above, the bond pads 113 of the first semiconductor die 110 are each located between a respective pair of leads 130. Thus, the electrical connection between the bond pads 113 and the first surfaces 131a of the leads 130 through the use of the conductive connectors 151 can be accomplished in a manner wherein the conductive connectors 151 are each located inwardly relative to the peripheral edge of the first semiconductor die 110. As seen in FIG. 1, the peripheral edge of the first semiconductor die 110 extends to approximately that portion of the second surface 131b of each lead 130 which is disposed in opposed relation to the third surface 131c.

In the semiconductor package 100, the first and second semiconductor dies 110, 120, the leads 130, and the conductive connectors 151, 153 are each encapsulated by an encapsulant in order to protect the same from the external environment. The hardening of the encapsulant defines an encapsulating portion 180 of the semiconductor package 100. The encapsulating portion 180 is formed such that the third surface 131c of each of the leads 130 and the bottom surface of the die paddle 135 are exposed within the encapsulating portion 180, and in particular the bottom surface defined thereby. Also exposed in the side surfaces of the encapsulating portion 180 is the outermost end of each of the leads 130. The exposed third surfaces 131c of the leads 130 may be electrically connected to an external device (e.g., a motherboard). Additionally, the exposed third surfaces 131c of the leads 130 and bottom surface of the die paddle 135 within the encapsulating portion 180 function as heat sinks which allow for the emission of heat generated by the first and second semiconductor dies 110, 120.

It is contemplated that the first and second semiconductor dies 110, 120 will have identical functions since the semiconductor dies 110, 120 are electrically connected to common leads 130. However, it is also contemplated that the first and second semiconductor dies 110, 120 may have different functions. In this case, the first semiconductor die 110 would be electrically connected to the first surfaces 131a of certain ones of the leads 130, with the second semiconductor die 120 being electrically connected to the second surfaces 131b of certain ones of the leads 130 which are not electrically connected to the first semiconductor die 110. As such, the first and second semiconductor dies 110, 120 would not be electrically connected to any common lead 130. The orientation of the conductive connectors 151 inwardly relative to the peripheral edges of the stacked semiconductor dies 110, 120 allows for a reduction in the size of the semiconductor package 100.

Figure 2A:
FIGS. 2A through 2E are cross-sectional views illustrating a sequence of steps which may be employed for manufacturing the semiconductor package of the present invention.

Referring now to FIGS. 2A through 2E, the manufacturing method for the semiconductor package 100 of the present invention preferably comprises the initial step of providing the leads 130 and die paddle 135 oriented relative to each other in the above-described manner. Thereafter, the first surface 111a of the first semiconductor die 110 is bonded to the second surface 131b of each of the leads 130 and to the top surface of the die paddle 135 through the use of the die attach material 160 in the above-described manner (FIG. 2A). As explained above, the first semiconductor die 110 and the leads 130 are oriented relative to each other such that the bond pads 113 of the first semiconductor die 110 are not in direct contact with any of the second surfaces 131b of the leads 130, but rather are each oriented between a respective pair of the leads 130.

Figure 2B:
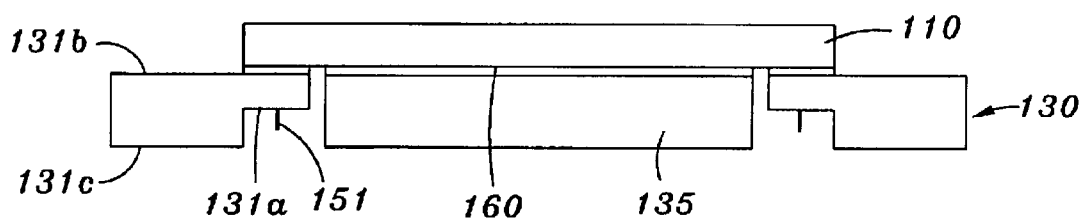
Figure 2C:
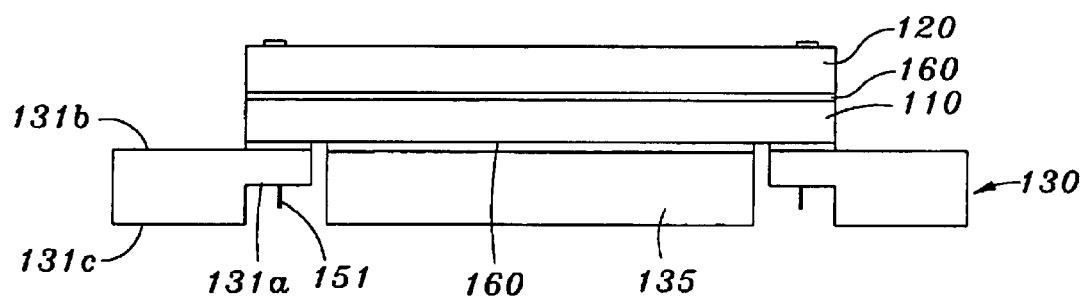

Subsequent to the attachment of the first semiconductor die 110 to the leads 130 and die paddle 135, the bond pads 113 of the first semiconductor die 110 are electrically connected to respective ones of the first surfaces 131a of the leads 130 through the use of the first conductive connectors 151 (FIG. 2B). Thereafter, the first surface 121a of the second semiconductor die 120 is bonded to the second surface 111b of the first semiconductor die 110 by another layer of the die attach material 160 (FIG. 2C).

Figure 2D:
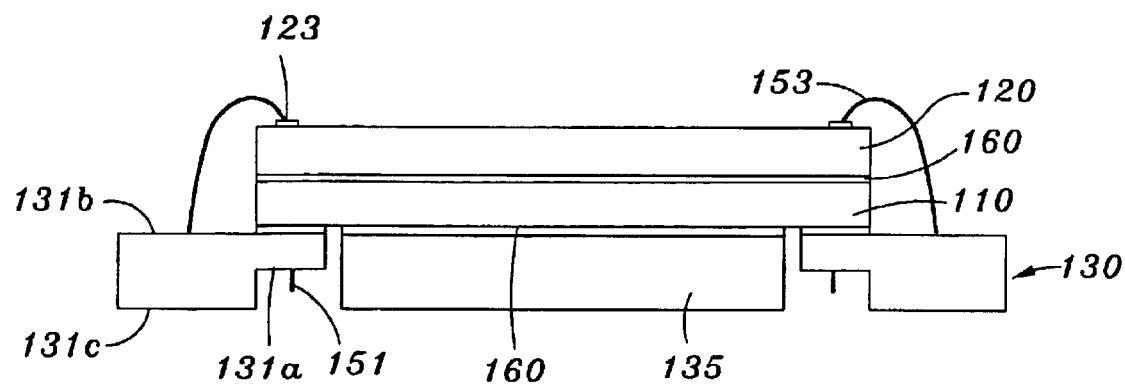
Figure 2E:
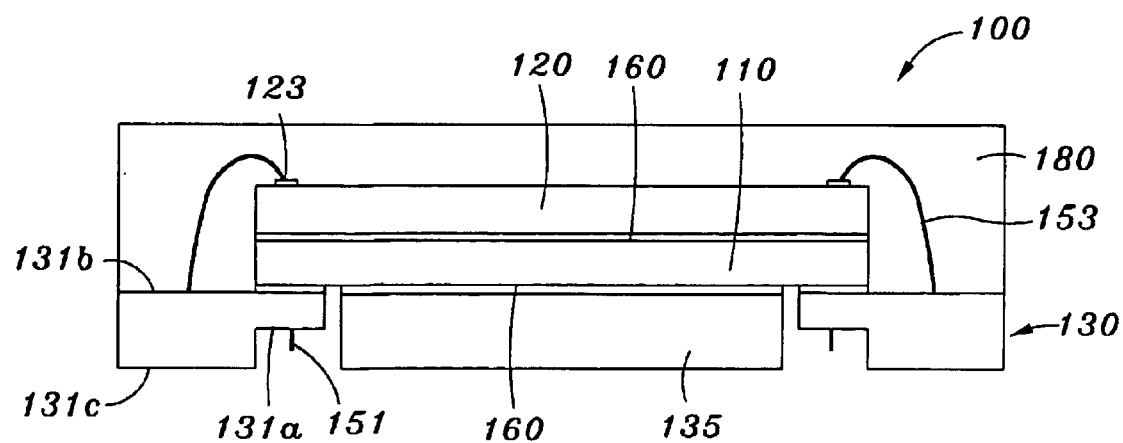

Subsequent to the attachment of the second semiconductor die 120 to the first semiconductor die 110, the bond pads 123 of the second semiconductor die 120 are electrically connected to respective ones of the second surfaces 131b of the leads 130 through the use of the second conductive connectors 153 in the above-described manner (FIG. 2D). Thereafter, the encapsulant is applied to the first and second semiconductor dies 110, 120, the leads 130 and the first and second conductive connectors 151, 153 to encapsulate the same and form the encapsulating portion 180 (FIG. 2E). As indicated above, the encapsulating portion 180 protects the first and second semiconductor dies 110, 120, the leads 130, and the first and second conductive connectors 151, 153 from the external environment.

It is contemplated that the second semiconductor die 120 may be bonded to the first semiconductor die 110 via a layer of the die attach material 160, with the first semiconductor die 110 thereafter being bonded to the leads 130 in the above-described manner. It is further contemplated that the bonding order of the first and second conductive connectors 151, 153 used to facilitate the electrical connection of the first and second semiconductor dies 110, 120, respectively, to the leads 130 can be changed or reversed from that described above if warranted by the circumstance.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A semiconductor package comprising:
    a plurality of leads, each of the leads defining:
        a first surface;
        a second surface disposed in opposed relation to the first surface; and
        a third surface disposed in opposed relation to the second surface, the first surface being oriented between the second and third surfaces;
    a first semiconductor die defining opposed first and second surfaces and including a plurality of bond pads disposed on the first surface thereof, portions of the first surface of the first semiconductor die being directly attached to the second surface of each of the leads such that at least some of the bond pads of the first semiconductor die are located between and laterally adjacent to a respective pair of the leads so that the bond pads of the first semiconductor die do not contact the second surface of any one of the leads;
    a second semiconductor die defining opposed first and second surfaces and including a plurality of bond pads disposed on the second surface thereof, the first surface of the second semiconductor die being attached to the second surface of the first semiconductor die;
    a plurality of conductive connectors electrically connecting the bond pads of the first and second semiconductor dies to respective ones of the leads; and
    an encapsulating portion applied to and at least partially encapsulating the leads, the first and second semiconductor dies, and the conductive connectors.

2. The semiconductor package of claim 1 wherein the conductive connectors comprise conductive wires.

3. The semiconductor package of claim 1 wherein:
    the conductive connectors comprise first and second conductive wires;
    the bond pads of the first semiconductor die are electrically connected to respective ones of the first surfaces of the leads by the first conductive wires; and
    the bond pads of the second semiconductor die are electrically connected to respective ones of the second surfaces of the leads by the second conductive wires.

4. The semiconductor package of claim 1 further comprising:
    a die paddle defining opposed top and bottom surfaces, the leads being disposed about the die paddle;
    the first surface of the first semiconductor die further being attached to the top surface of the die paddle.

5. The semiconductor package of claim 4 wherein:
    the first surface of the first semiconductor die is attached to the second surface of each of the leads and to the top surface of the die paddle by a first bonding means; and
    the first surface of the second semiconductor die is attached to the second surface of the first semiconductor die by a second bonding means.

6. The semiconductor package of claim 4 wherein:
    the die paddle is formed to have a die paddle thickness;
    each of the leads is formed to have a lead thickness between the second and third surfaces thereof; and
    the die paddle thickness is substantially equal to the lead thickness.

7. The semiconductor package of claim 4 wherein the encapsulating portion is applied to the die paddle such that the bottom surface of the die paddle is exposed within the encapsulating portion.

8. The semiconductor package of claim 7 wherein the encapsulating portion is applied to the leads such that the third surface of each of the leads is exposed within the encapsulating portion.

9. The semiconductor package of claim 1 wherein the encapsulating portion is applied to the leads such that the third surface of each of the leads is exposed within the encapsulating portion.

10. The semiconductor package of claim 1 wherein:
    the first semiconductor die defines a peripheral edge; and
    the conductive connectors electrically connecting the bond pads of the first semiconductor die to the leads are oriented inwardly relative to the peripheral edge of the first semiconductor die.

11. A semiconductor package comprising:
    a plurality of leads;
    a first semiconductor die including a plurality of bond pads disposed thereon, the first semiconductor die being directly attached to each of the leads such that at least some of the bond pads of the first semiconductor die are located between and laterally adjacent to a respective pair of the leads so that the bond pads of the first semiconductor die do not contact any of the leads;
    a second semiconductor die including a plurality of bond pads disposed thereon, the second semiconductor die being attached to the first semiconductor die;
    means for electrically connecting the bond pads of the first and second semiconductor dies to respective ones of the leads; and
    an encapsulating portion applied to and at least partially encapsulating the leads, the first and second semiconductor dies, and the electrical connection means.

12. The semiconductor package of claim 11 wherein the electrical connection means comprises conductive wires.

13. The semiconductor package of claim 12 wherein:

each of the leads defines opposed first and second surfaces and a third surface which is opposed to the second surface, the first surface being oriented between the second and third surfaces;

the bond pads of the first semiconductor die are electrically connected to respective ones of the first surfaces of the leads by first conductive wires; and the bond pads of the second semiconductor die are electrically connected to respective ones of the second surfaces of the leads by second conductive wires.

14. The semiconductor package of claim 13 wherein the encapsulating portion is applied to the leads such that the third surface of each of the leads is exposed within the encapsulating portion.

15. The semiconductor package of claim 11 further comprising:

a die paddle, the leads being disposed about the die paddle;

the first semiconductor die being attached to the die paddle.

16. The semiconductor package of claim 15 wherein:

the die paddle defines opposed top and bottom surfaces, with the first semiconductor die being attached to the top surface of the die paddle; and the encapsulating portion is applied to the die paddle such that the bottom surface of the die paddle is exposed within the encapsulating portion.

* * * * *